US009541269B2

(12) United States Patent
Libon et al.

(10) Patent No.: US 9,541,269 B2
(45) Date of Patent: Jan. 10, 2017

(54) METHOD FOR MANUFACTURING A LIGHTING ARRANGEMENT

(71) Applicant: KONINKLIJKE PHILIPS N.V., Eindhoven (NL)

(72) Inventors: Sébastien Paul René Libon, Eindhoven (NL); Johannes Wilhelmus Weekamp, Eindhoven (NL)

(73) Assignee: PHILIPS LIGHTING HOLDING B.V., Eindhoven (NL)

(*) Notice: Subject to any disclaimer, the term of this patent is extended or adjusted under 35 U.S.C. 154(b) by 0 days.

(21) Appl. No.: 14/901,381

(22) PCT Filed: Jul. 23, 2014

(86) PCT No.: PCT/EP2014/065823
§ 371 (c)(1),
(2) Date: Dec. 28, 2015

(87) PCT Pub. No.: WO2015/011191
PCT Pub. Date: Jan. 29, 2015

(65) Prior Publication Data

US 2016/0146439 A1 May 26, 2016

(30) Foreign Application Priority Data

Jul. 23, 2013 (EP) .................................... 13177532

(51) Int. Cl.
*H05K 3/30* (2006.01)
*F21V 23/00* (2015.01)
(Continued)

(52) U.S. Cl.
CPC ................ *F21V 23/001* (2013.01); *F21S 4/15* (2016.01); *F21V 19/0025* (2013.01);
(Continued)

(58) Field of Classification Search
CPC ................................ F25B 41/00; F25B 45/00
See application file for complete search history.

(56) References Cited

U.S. PATENT DOCUMENTS 6,880,955 B2 * 4/2005 Lin ........................ H05K 1/189 362/237
7,455,427 B1 * 11/2008 Freeman ................ E04H 15/10 135/91
(Continued)

FOREIGN PATENT DOCUMENTS

CN 201836728 U 5/2011
DE 19818227 A1 10/1999
(Continued)

*Primary Examiner* — Minh Trinh

(57) ABSTRACT

Disclosed is method of manufacturing a lighting arrangement (100) comprising a plurality of conductive wires (110) organized in a flexible grid comprising a plurality of grid nodes (115), each grid node comprising a first one of said conductive wires and a second one of said conductive wires, at least some of the grid nodes further comprising a solid state lighting element (120) conductively coupled to the first one of said conductive wires and the second one of said conductive wires, wherein each grid node comprises a mechanical support member (130, 134) including a polymer portion (130) embedding the first one of said conductive wires and the second one of said conductive wires.

7 Claims, 13 Drawing Sheets

(51) Int. Cl.
*F21V 31/04* (2006.01)
*F21V 19/00* (2006.01)
*F21Y 101/00* (2016.01)

(52) U.S. Cl.
CPC ........... *F21V 31/04* (2013.01); *F21Y 2101/00* (2013.01); *F21Y 2105/10* (2016.08); *F21Y 2115/10* (2016.08)

(56) References Cited

U.S. PATENT DOCUMENTS

| | | | | |
|---|---|---|---|---|
| 8,836,245 | B2 * | 9/2014 | Dau | F21K 9/135 315/312 |
| 9,232,663 | B2 * | 1/2016 | Dingemans | H05K 3/202 |
| 2003/0137839 | A1 * | 7/2003 | Lin | H05K 1/189 362/237 |
| 2004/0252501 | A1 * | 12/2004 | Moriyama | F21K 9/17 362/238 |
| 2005/0036311 | A1 * | 2/2005 | Liu | F21S 4/10 362/249.01 |
| 2006/0132048 | A1 * | 6/2006 | Popovich | G09F 9/30 315/160 |
| 2008/0123334 | A1 * | 5/2008 | Hochstein | F21V 29/004 362/249.01 |
| 2009/0091932 | A1 | 4/2009 | Weekamp | |
| 2009/0190351 | A1 | 7/2009 | Shiraishi | |
| 2012/0206909 | A1 * | 8/2012 | Morgan | F21V 23/06 362/217.16 |

FOREIGN PATENT DOCUMENTS

| | | | |
|---|---|---|---|
| DE | 102008054288 | A1 | 5/2010 |
| WO | 2012095812 | A2 | 7/2012 |

* cited by examiner

100

METHOD FOR MANUFACTURING A LIGHTING ARRANGEMENT

CROSS-REFERENCE TO PRIOR APPLICATIONS

This application is the U.S. National Phase application under 35 U.S.C. §371 of International Application No. PCT/EP2014/065823, filed on Jul. 23, 2014, which claims the benefit of International Application No. 13177532.2 filed on Jul. 23, 2013. These applications are hereby incorporated by reference herein.

FIELD OF THE INVENTION

The present invention relates to a method of manufacturing a lighting arrangement, wherein the lighting arrangement comprises a plurality of conductive wires organized in a flexible grid comprising a plurality of grid nodes, each grid node comprising a first one of said conductive wires, a second one of said conductive wires and a solid state lighting element conductively coupled to the first one of said conductive wires and the second one of said conductive wires.

BACKGROUND OF THE INVENTION

Solid state lighting, e.g. lighting based on light emitting diodes (LEDs), is increasingly considered as the environmentally responsible replacement of more energy-inefficient traditional alternatives such as fluorescent and incandescent light sources. In addition, solid state lighting has found its way into new application domains, such as liquid crystal display technology, where backlights made from LEDs yield a superior viewing experience compared to more traditional backlighting.

One particular drawback of solid state lighting solutions is cost. For instance, because LEDs are fragile, the LEDs are usually mounted on a carrier such as a printed circuit board, which may be diced and packaged into single units. This increases the cost of the lighting arrangement, in particular if a large number of LEDs are required in the arrangement, such as for instance in a backlighting panel.

US-2009/0091932 discloses a lighting arrangement according to the opening paragraph. A flexible wire grid is provided as a support for the LEDs such that large area carriers for the LEDs can be avoided, thus reducing the cost of the arrangement. The protection of the LEDs on this grid against damage however may be improved. Especially the stresses generated during the stretching step of its manufacturing process can damage the interconnects between the LEDs and the wires on which the LEDs are mounted.

WO-2012/095812 discloses a method for embedding a non-embedded or bare LED network, wherein the method comprises the steps of providing said non-embedded LED network associated with a continuous flexible support; applying in a continuous manner a flexible insulation layer on a liquid basis (for example a non-thermoplastic material such as a silicone derivative) onto said non-embedded LED network associated with said continuous flexible support.

SUMMARY OF THE INVENTION

The present invention seeks to provide a method of manufacturing a more robust flexible grid-based lighting arrangement.

In accordance with the present invention there is provided a method of manufacturing a lighting arrangement, the method comprising winding a plurality of conductive wires in parallel around a support; defining a plurality of grid nodes by conductively coupling a plurality of solid state elements to said plurality of conductive wires such that each solid state element is conductively coupled to a first one of said conductive wires and a second one of said conductive wires; forming a mechanical support member at each grid node by embedding a portion of the first one of said conductive wires and a portion of the second one of said conductive wires in a polymer portion; dicing the mechanical support member; and releasing the resultant structure from the support.

This manufacturing method yields a robust and yet flexible lighting arrangement in which the grid nodes are protected against damage upon deforming, e.g. stretching the lighting arrangement.

The embedding step of the manufacturing method may further comprise immobilizing the portion of the first one of said conductive wires and the portion of the second one of said conductive wires on the mesh using said polymer portion. This further reinforces the grid nodes, thus further improving the robustness of the lighting arrangement.

The immobilizing step may further comprise encapsulating the portion of the first one of said conductive wires and the portion of the second one of said conductive wires in said polymer portion to further provide electrical insulation of the grid nodes.

Alternatively, the embedding step may further comprise encapsulating at least the plurality of grid nodes in an encapsulant comprising the polymer portion, e.g. in the absence of the mesh.

The step of encapsulating at least the plurality of grid nodes may further comprise encapsulating sections of the conductive wires that interconnect grid nodes in said polymer portion. This yields a lighting arrangement of which the grid nodes are reinforced and less prone to being damaged during the stretching process of the lighting arrangement, e.g. has improved lifetime characteristics and that can be used outdoors.

The manufacturing method according to the present invention may be used to manufacture a lighting arrangement comprising a plurality of conductive wires organized in a flexible grid comprising a plurality of grid nodes, each grid node comprising a first one of said conductive wires and a second one of said conductive wires, wherein at least some of the grid nodes comprise a solid state lighting element conductively coupled to the first one of said conductive wires and the second one of said conductive wires, wherein each grid node comprises a mechanical support member including a polymer portion embedding the first one of said conductive wires and the second one of said conductive wires.

By providing a mechanical support member supporting the grid nodes, the interconnects between the solid state lighting (SSL) elements and the wires on which the SSL elements are mounted are protected against the stresses generated during flexing or stretching of the flexible grid, thus producing a more robust lighting arrangement.

The mechanical support member may comprise a support body to further reinforce the grid nodes. Such a support body may be a plastic sheet and/or may have a mesh structure such as a woven or non-woven fabric, a glass fiber or metal mesh and so on, wherein the polymer portion immobilizes the first one of said conductive wires and the second one of said conductive wires on said mesh structure.

The polymer portion may be a polymer coating encapsulating the first one of said conductive wires and the second one of said conductive wires. This not only protects the grid nodes from damage during bending or stretching of the lighting arrangement but may furthermore provide electrical insulation of the grid nodes. The polymer coating may be reinforced using fibers or wires.

The polymer portion may comprise a resin such as an epoxy resin. By providing a relatively inflexible or hard encapsulant, a particularly strong protection of the grid nodes is achieved.

Alternatively, sections of the conductive wires that interconnect grid nodes may also be encapsulated by said polymer portion, as this provides a lighting arrangement that is waterproof and can be used outdoors. In this embodiment, it is particularly preferred if the polymer coating comprises an elastomer such as a silicone-based elastomer, as this ensures that the flexibility of the grid is largely maintained.

At least some of the grid nodes may comprise an electrical circuit arrangement for controlling the lighting arrangement. Such electrical arrangements may share a grid node with a SSL element or may be located at a dedicated grid node.

Each solid state lighting element may comprise a first contact and a second contact, wherein the first contact is soldered to the first one of said conductive wires and the second contact is soldered to a second one of said conductive wires. The direct placement of the SSL elements on the wire grid further reduces the manufacturing complexity and cost of the lighting arrangement.

Each solid state lighting element may be mounted on a carrier, and wherein the solid state lighting element is conductively coupled to the first one of said conductive wires and the second one of said conductive wires via said carrier. This is for instance advantageous if the encapsulant is not reinforced, as the carrier provides additional resilience to the SSL element.

Each carrier may comprise a further solid state element, each solid state element on said carrier being adapted to generate a different color, wherein each grid node comprises a third one of said conductive wires for providing a control signal to the solid state element and the further solid state element. This provides a flexible lighting arrangement capable of generating variable lighting patterns, e.g. by way of color variation.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
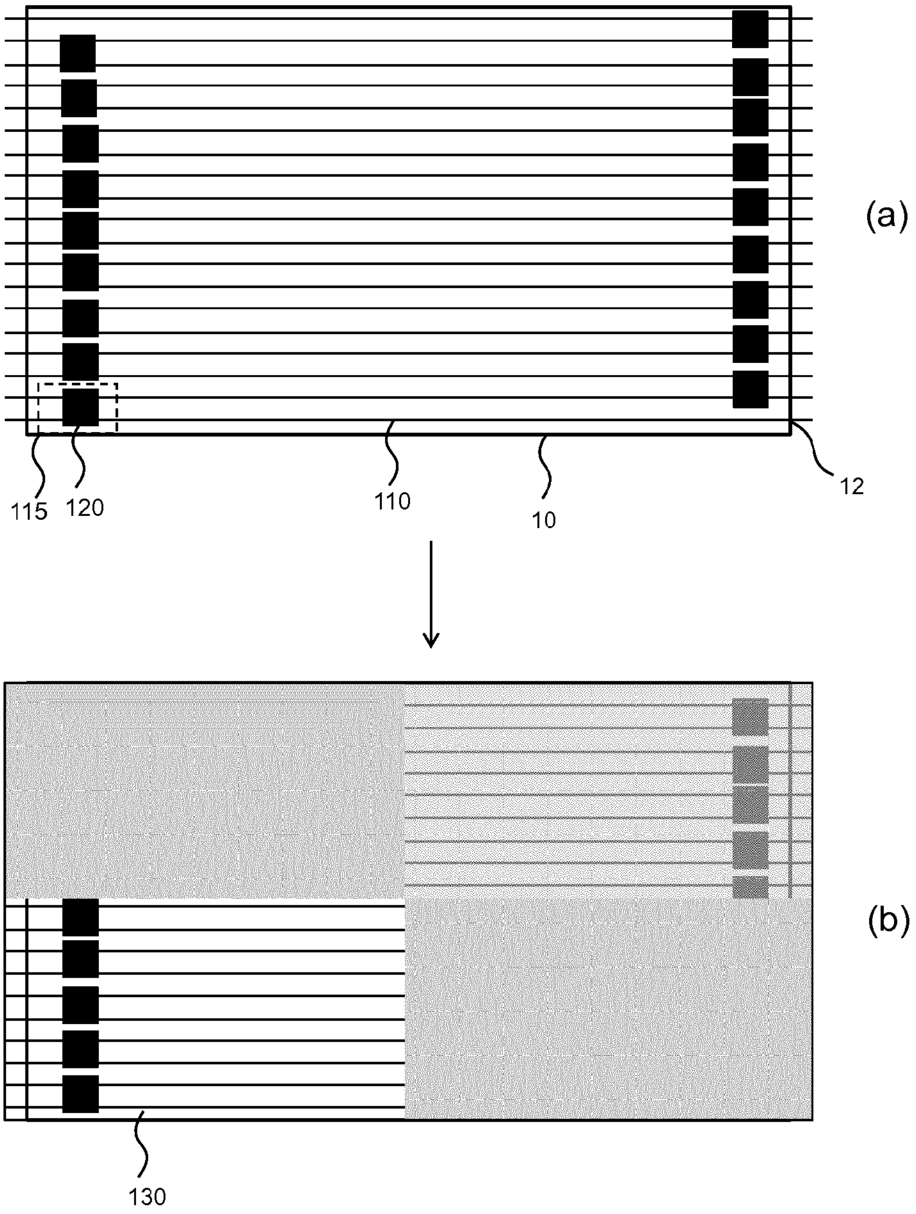
FIG. 1 schematically depicts a method of manufacturing a lighting arrangement in accordance with an embodiment of the present invention.
Figure 1:
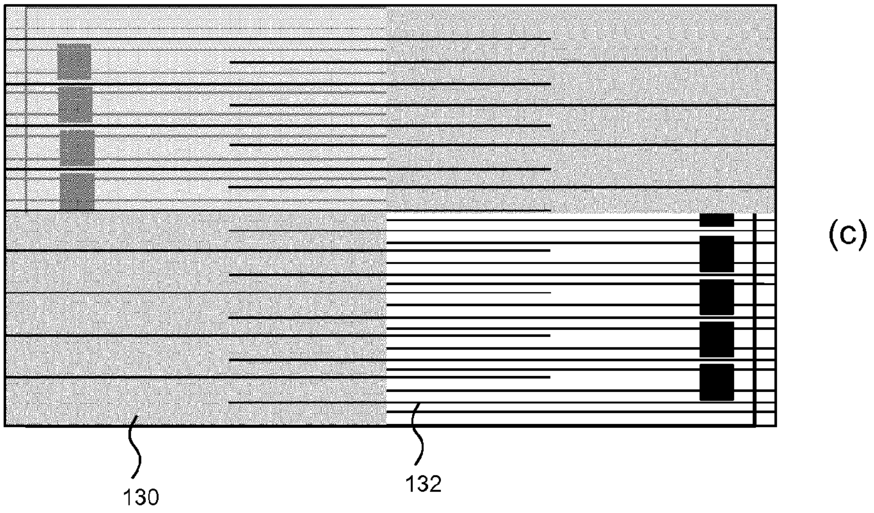
Figure 1:
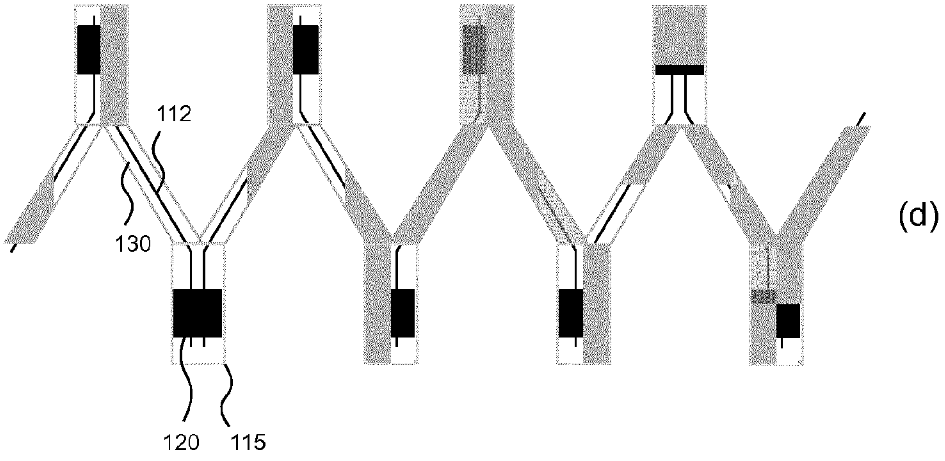

It should be understood that the Figures are merely schematic and are not drawn to scale. It should also be understood that the same reference numerals are used throughout the Figures to indicate the same or similar parts.

FIG. 1 schematically depicts a method of manufacturing a flexible lighting arrangement 100 in accordance with an embodiment of the present invention. In step (a), a support 10 is provided around which a plurality of wires 110 are wound. The support 10 may be a flat support comprising a plurality of grooves 12 for receiving respective segments of the wires 110. The support 10 may be made of any suitable material. In an embodiment, the support 10 is a metal plate.

The wires 110 are typically electrically conductive wires, e.g. metal wires such as copper, metal alloy wires such as steel wires, and so on. It should be understood that in the context of the present invention, an electrically conductive wire is not limited to conductive structures having a circular cross-section. Any suitably shaped elongated conductive structure, e.g. electrically conductive ribbons have square cross-sections, may be contemplated.

In step (a), a plurality of solid state lighting (SSL) elements 120, e.g. organic or inorganic light emitting diodes are mounted on the electrically conductive wires 110 to define a plurality of grid nodes 115. Each grid node 115 comprises a portion of a first one and a portion of a second one of the electrically conductive wires 110, wherein the SSL element 120 has a first contact secured on the portion of the first electrically conductive wire 110 and a second contact secured on the portion of the second electrically conductive wire 110.

In an embodiment, the contacts of the SSL element 120 are preferably secured on the electrically conductive wires 110 using a solder. Any suitable solder composition may be used. The direct mounting of the SSL elements 120 on the various portions of the electrically conductive wires 110 has the advantage that the contacts of the SSL elements 120 can be placed into a solder paste applied on the electrically conductive wires 110, such that all SSL elements 120 can be readily soldered onto the electrically conductive wires 110 in a subsequent step, thereby immobilizing the SSL elements 120 on the various portions of the electrically conductive wires 110. This provides a straightforward and cost-effective way of mounting the SSL elements 120 on the various portions of the electrically conductive wires 110.

In an alternative embodiment, each SSL element 120 is mounted on a carrier such as a printed circuit board, in which case the carrier comprises a pair of contacts that may be electrically connected to the various portions of the electrically conductive wires 110 as described above, e.g. through soldering. This adds a component (the carrier) to the design of the lighting arrangement 100, thereby increasing its cost, but has the benefit of increasing the robustness of the lighting arrangement 100, in particular of the grid nodes 115, as bending or stretching forces applied to the flexible lighting arrangement 100 are less likely to damage the interconnections, e.g. solder points, between the SSL elements 120 and the electrically conductive wires 110.

As can be seen in step (a), a plurality of grid nodes 115 is defined on opposite sides of the support 10, with each grid node comprising a wire portion of neighboring wires 110. In the context of the present invention, a grid node 115 is defined as a portion of a flexible grid of the lighting arrangement 100 that resists deformation, i.e. is more inflexible than the segments of the electrically conductive wires 110 interconnecting grid nodes 115. A grid node typically comprises two or more parallel portions of electrically conductive wires 110 that remain substantially parallel upon deformation of the flexible grid of the lighting arrangement 100. One or more electrically insulating bridging member bridging between the two or more parallel portions of electrically conductive wires 110 may be present in the grid nodes 115 to enforce the rigidity of the grid nodes 115.

A grid node 115 on a first side of the support 10 shares one electrically conductive wire 110 with a grid node 115 on the opposite side of the support 10, whereas the grid nodes 115 on the same side of the support 10 do not share an electrically conductive wire 110. It is noted that this is a non-limiting example of a suitable grid arrangement, and other suitable grid layouts, e.g. a grid layout in which multiple grid nodes 115 share the same pairs of electrically conductive wires 110 such as a ladder arrangement in which the electrically conductive wires 110 define the uprights of the ladder and the grid nodes 115 define the steps of the ladder, are equally feasible. The number of electrically conductive wires 110 in each grid node 115 is furthermore not limited to two. In general, each grid node may include portions of N electrically conductive wires 110, in which N is a positive integer of value 2 or more. This will be demonstrated in more detail later.

In step (b), the electrically conductive wires 110 and the grid nodes 115 are embedded in a polymer coating 130, which is transparent or translucent such that the light produced by the SSL elements 120 will at least in part pass through the polymer coating 130. This may be achieved in any suitably manner, e.g. by providing a polymer precursor composition over the electrically conductive wires 110 and the grid nodes 115 and subsequently curing the composition to form the polymer coating 130, by heating the polymer 130 to increase its fluidity and depositing the fluidic polymer over the electrically conductive wires 110 and the grid nodes 115, and so on.

In the context of the present application, embedded should be interpreted to mean partially or fully encapsulated. In the embodiment of FIG. 1, the electrically conductive wires 110 and the grid nodes 115 are fully encapsulated by the polymer coating 130.

In this embodiment, the polymer coating 130 preferably is an elastomer to remain the flexibility of the wire grid to the largest extent possible. The polymer 130 typically is an electrically insulating polymer. Suitable elastomers include silicones, polyurethanes, block co-polymers such as polystyrene-based block-copolymers, and so on, although it should be understood that any suitable flexible electrically insulating polymer may be used. Silicones are particularly preferred.

The polymer coating 130 not only electrically insulates the lighting arrangement 100 from environmental exposure, thus making it suitable for outdoor use, but also acts as a mechanical support member to the grid nodes 115, as the portions of the polymer coating 130 encapsulating the grid nodes 115 protect the grid nodes and in particular the electrical contacts between the SSL elements 120 and the portions of the electrically conductive wires 110 from becoming exposed to excessive forces when the flexible lighting arrangement 100 is deformed, e.g. stretched. During such deformation processes, the segments of the electrically conductive wires 110 that interconnect respective grid nodes 115 are typically spread apart, thereby increasing the inter-wire distance between such neighboring wires. However, the portions of the polymer 130 each acting as a mechanical support member to each of the grid nodes 115 prevents the inter-wire distance between the portions of the electrically conductive wires 110 from being increased, thereby protecting the electrical connections between the contacts of the SSL elements 120 (or its carriers) and the portions of the electrically conductive wires 110 of the grid nodes 115.

In step (c), the polymer coating 130 is diced, i.e. incisions 132 are formed in the polymer coating 130 to individualize the electrically conductive wires 110 in between the grid nodes 115. This may be achieved in any suitable manner, e.g. using a press with a cutting blade to form the incisions 132 in the polymer coating 130 by cutting. The resultant structure is subsequently removed from the support 10, after which the resultant flexible lighting arrangement 100 may be stretched as shown in step (d) by increasing the inter-wire distance between wire segments 112 that extend between opposite grid nodes 115, whilst the SSL elements 120 are protected from becoming disconnected from the wire portions in the grid nodes 115 during the deformation (stretching) of the flexible lighting arrangement 100 as previously explained.

At this point, it is noted that in step (a) it is equally feasible to wind a single electrically conductive wire 110 around the support 10, which single electrically conductive wire 110 may subsequently be cut into a plurality of single electrically conductive wires 110, e.g. by cutting the single electrically conductive wire 110 at the grooves 12. This cutting step may be performed at any suitable point in the manufacturing process of the lighting arrangement 100, e.g. before depositing the polymer coating 130 such that the end portions of the cut electrically conductive wires 110 are also encapsulated by the polymer coating 130.

Figure 2:
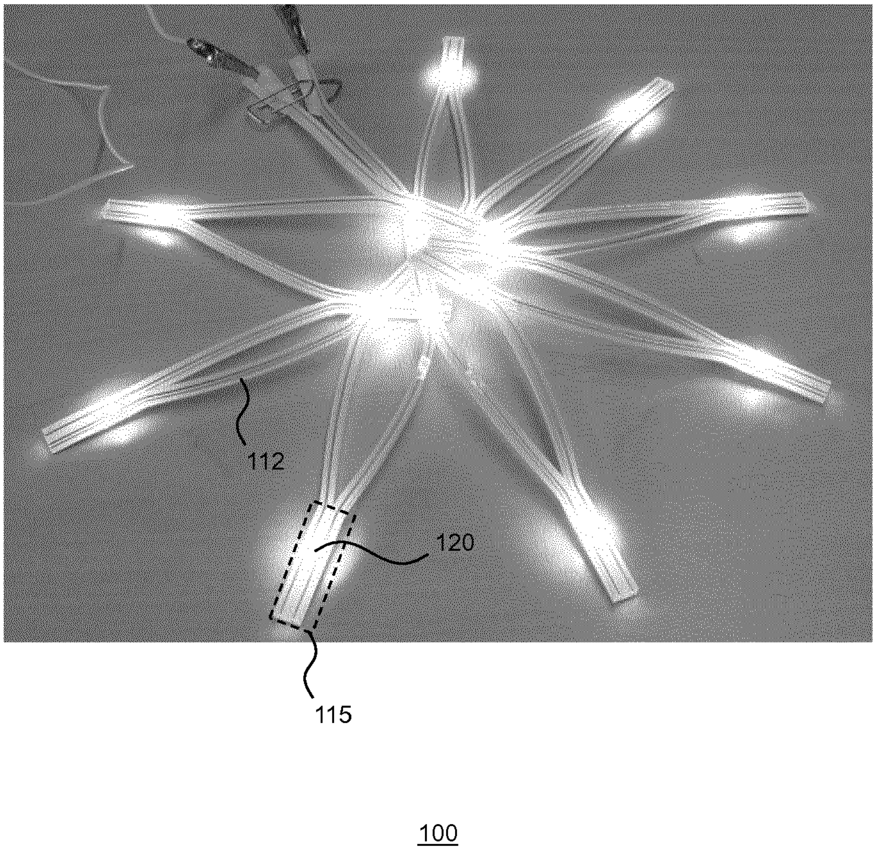
FIG. 2 is an image of a lighting arrangement manufactured in accordance with the method of FIG. 1.

FIG. 2 shows an image of a lighting arrangement 100 manufactured in accordance with the method of FIG. 1. The lighting arrangement 100 comprises a grid of electrically conductive wire segments 112 interconnecting a plurality of grid nodes 115. The stretched wire segments 112 can be recognized together with the grid nodes 115 including the SSL elements 120. In FIG. 2, the lighting arrangement 100 is encapsulated in a silicone-based polymer coating 130. As can be seen, the lighting arrangement 100 is highly flexible and can be manipulated into a wide variety of shapes without compromising the structural integrity of the electrical connections between the SSL elements 120 and the electrically conductive wire portions in the grid nodes 115.

Figure 3:
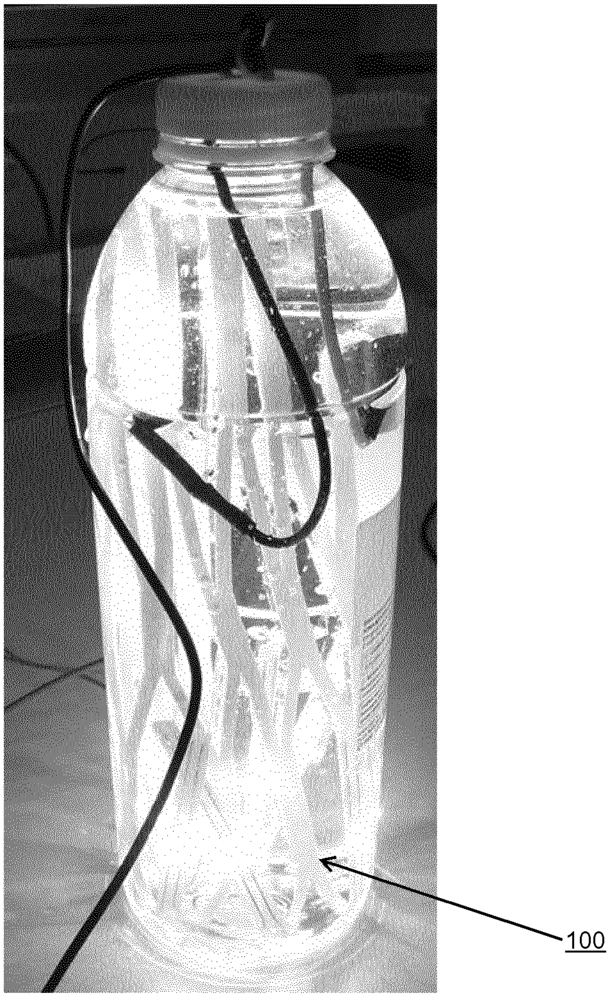
FIG. 3 is another image of a lighting arrangement manufactured in accordance with the method of FIG. 1.

FIG. 3 shows an image of the lighting arrangement 100 of FIG. 2 immersed in a jar filled with water. The lighting arrangement 100 was fully immersed in the water for over a year without losing functionality, thus demonstrating the water-tight nature of the silicone-based polymer coating 130. Electrical connections to the lighting arrangement 100 were provided using a pair of shrink tubes including a thermally activated adhesive, which were glued onto the terminals of the lighting arrangement 100 by heating the shrink tubes.

Figure 4:
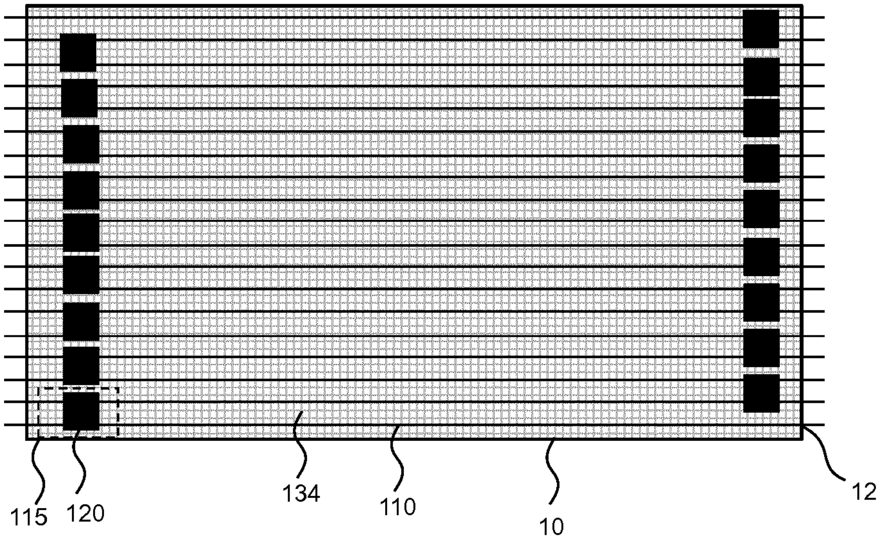
FIG. 4 schematically depicts an aspect of a method of manufacturing a lighting arrangement in accordance with another embodiment of the present invention.

In an embodiment, the method shown in FIG. 1 may be extended as shown in FIG. 4 by providing a support body 134 such as a polymer or plastic sheet or a mesh structure such as a woven or non-woven fabric, e.g. a polymer fabric such as a polyester mat, a glass fiber mat, a metal wire mesh and so on, over the support 10 prior to positioning the electrically conductive wires 110 on the support 10. This further reinforces the polymer coating 130, thus providing further protection to the electrical connections between the SSL elements 120 and the wire portions in the grid nodes 115. The support body 134 preferably is an electrically insulating.

In an embodiment, the support body 134 comprises a plastic sheet, which preferably is made from a thermoplastic material. The polymer coating 130 may be adhered to the support body 134 in any suitable manner. For instance, the polymer coating 130 may naturally adhere to the support body 134 or an adhesion promoter may be used to improve the adhesion between the polymer coating 130 and the support body 134, as is well-known per se in the field of polymer chemistry.

Alternatively, the support body 134 may have a mesh structure. The open nature of the mesh structure ensures that the polymer coating 130 can penetrate the support body 134, thereby forming a strong physical bond between the polymer coating 130 and the support body 134. In FIG. 4, the support body 134 is provided over the whole surface of the support 10 by way of non-limiting example. It is for instance equally feasible to provide the support body 134 over those parts of the surface of the support 10 where the grid nodes 115 are to be formed, such that only the grid nodes 115 comprise a mechanical support member comprising a polymer coating 130 reinforced with the support body 134, whereas the segments 112 of the electrically conductive wires 110 are encapsulated by the polymer coating 130 only. This ensures that the segments 112 of the electrically conductive wires 110 that interconnect respective grid nodes 115 are kept as flexible as possible whilst providing additional resilience to the grid nodes 115 against the stretching and/or bending forces to which the lighting arrangement 100 is subjected during its deformation.

Figure 5:
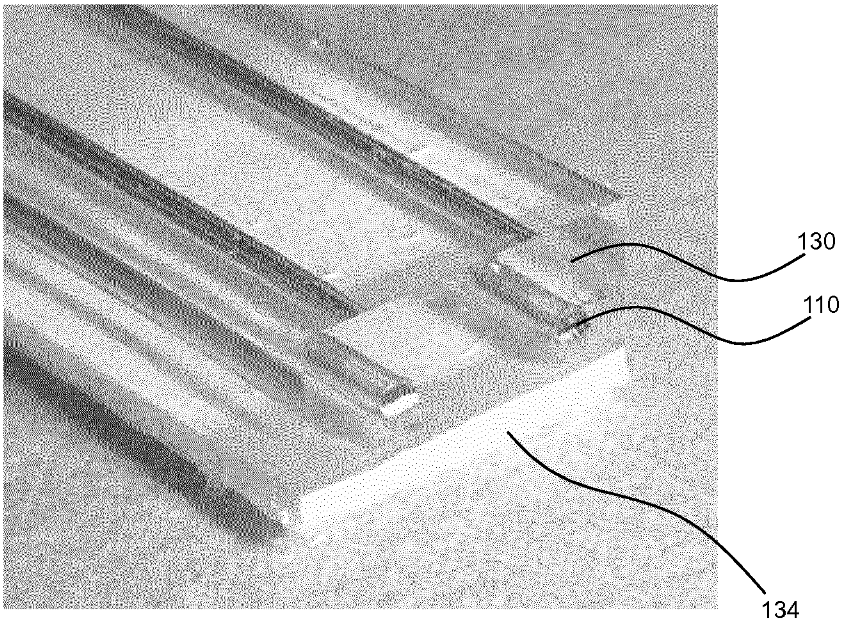
FIG. 5 is an image of a lighting arrangement manufactured in accordance with the method of FIG. 4.

FIG. 5 shows an image of a cross-section of a part of a lighting arrangement 100 manufactured in accordance with the method of FIG. 4. The electrically conductive wires 110 are encapsulated by a polymer coating 130 (here a silicone-based polymer), which coating is reinforced by a support body 134 in the form of a polyester mat. The polymer coating 130 is integrated with the polyester mat 134 by virtue of the polymer penetrating the fiber network of the mat.

At this point, it is noted that the mechanical support member comprising the polymer coating 130 of the grid nodes 115 may be additionally or alternatively be reinforced using fibrous materials, individual fibers or wires in the polymer coating 130.

The embodiments of the lighting arrangement 100 disclosed so far are based on a polymer coating 130 that encapsulates substantially the entire flexible grid, i.e. the grid nodes 115 and the segments 112 of the electrically conductive wires 110 interconnecting the respective grid nodes 115. However, it should be understood that the encapsulation of the segments 112 may be omitted in embodiments of the lighting arrangement 100 for indoor use, or any other use where the lighting arrangement 100 is not exposed to adverse environmental conditions.

Figure 6:
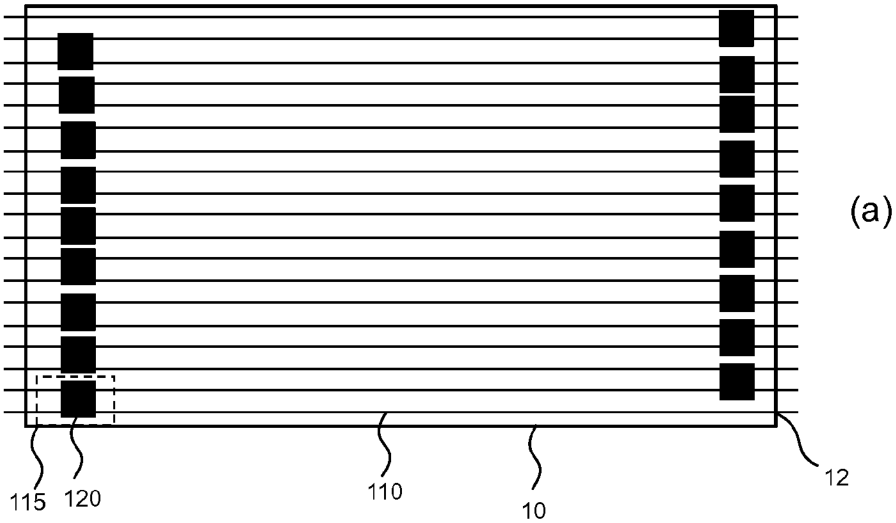
FIG. 6 schematically depicts a method of manufacturing a lighting arrangement in accordance with yet another embodiment of the present invention.
Figure 6:
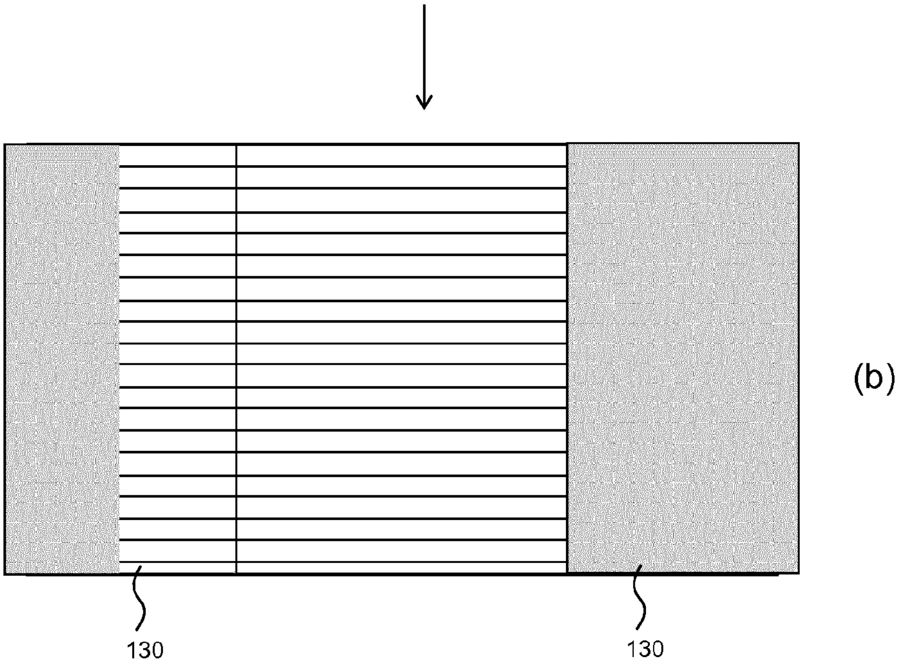
Figure 6:
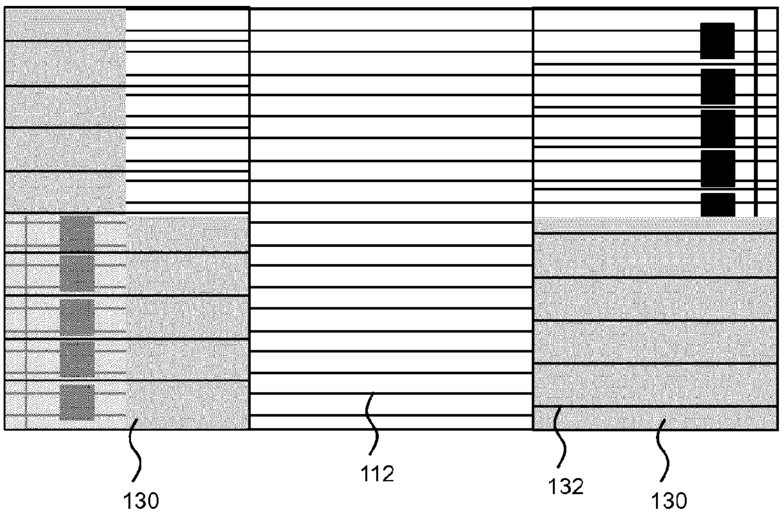
Figure 6:
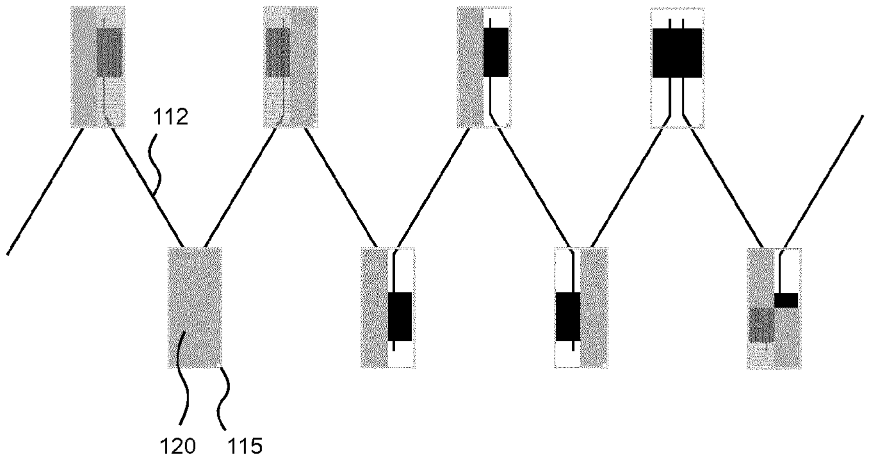

FIG. 6 schematically depicts a manufacturing method of a lighting arrangement 100 in which only the grid nodes 115 are encapsulated. Step (a) of FIG. 6 is identical to step (a) of FIG. 1 and will not be explained in further detail for the sake of brevity. In step (b), the polymer coating 130 is applied to the grid nodes 115 only, thus leaving exposed the segments 112 of the electrically conductive wires 110 in between the grid nodes 115. The same polymer as used in the method of FIG. 1 may be used.

Alternatively, a more rigid or inflexible polymer such as a resin, e.g. an epoxy resin, may be used as the polymer coating 130 no longer needs to support the overall flexibility of the flexible grid of the lighting arrangement 100 due to the fact that the wire segments 112 that provide the grid with its flexible are not encapsulated by the polymer coating 130. Such a rigid or inflexible polymer further improves the strength of the mechanical support member of the grid nodes 115 as defined by the polymer coating 130.

Although not shown in FIG. 6, it should be understood that the mechanical support member may further include the support body 134 or the fibrous materials, individual fibers or wires to reinforce the polymer coating 130 as previously explained.

The lighting arrangement 100 may be finalized as shown in FIG. 1, i.e. by forming incisions 132 in the polymer coating 130 to individualize the grid nodes 115 as shown in step (c), after which the lighting arrangement 100 may be stretched as shown in step (d). Step (d) shows that only the grid nodes 115 including the SSL elements 120 are encapsulated by the polymer coating 130, whilst the segments 112 of the electrically conductive wires 110 that interconnect the grid nodes 115 are left bare, i.e. uncoated by the polymer coating 130. Step (c) and (d) are essentially the same as the same steps of FIG. 1 and reference is made to the detailed description of these steps of FIG. 1 for the sake of brevity.

Figure 7:
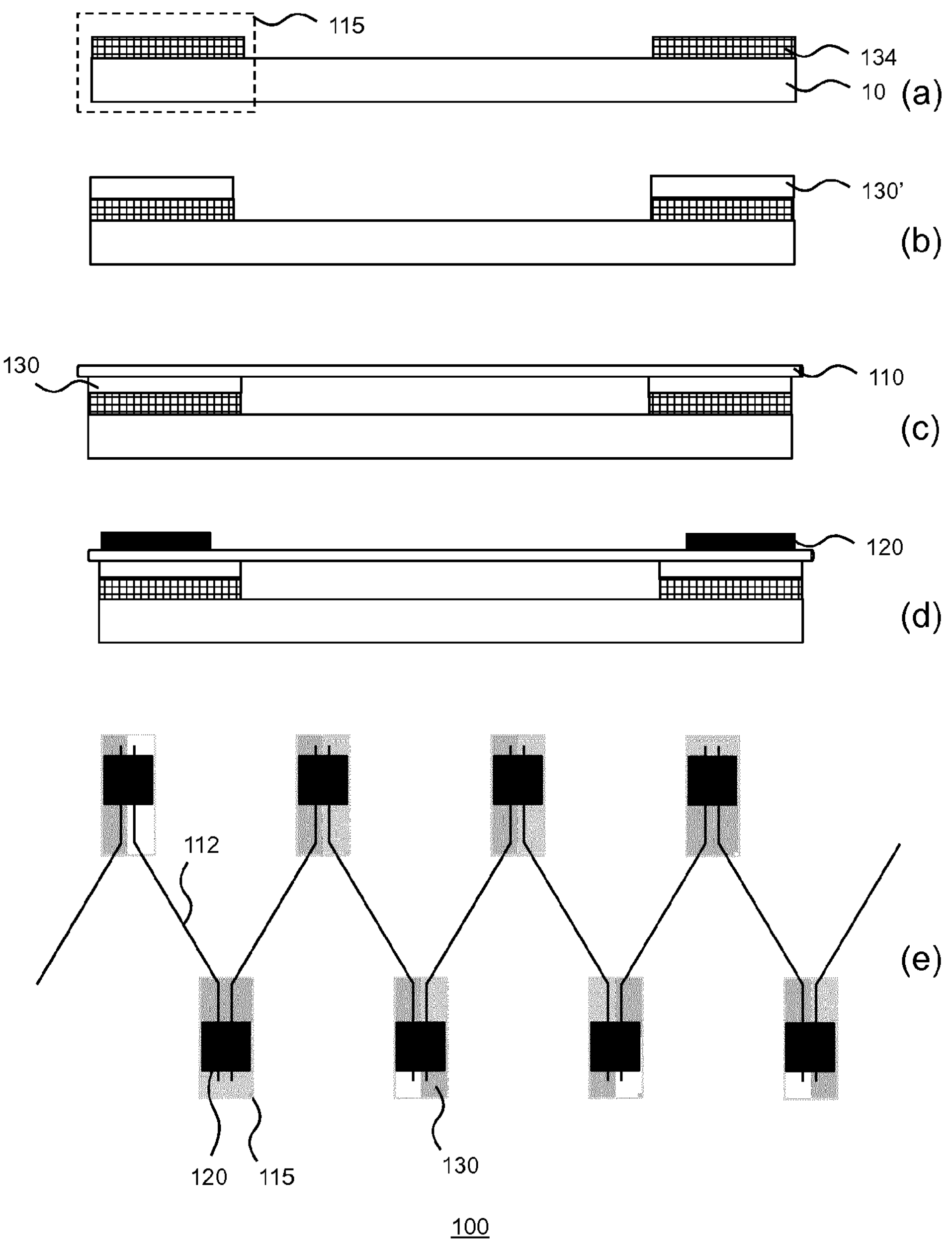
FIG. 7 schematically depicts a lighting arrangement manufactured in accordance with the method of the present invention.

In the aforementioned embodiments, the polymer coating 130 encapsulates the grid nodes 115 and optionally the segments 112 of the electrically conductive wires 110 in between the grid nodes. However, in certain embodiments of the present invention, the grid nodes 115 are not fully encapsulated by the polymer coating 130. FIG. 7 schematically depicts a method of manufacturing a lighting arrangement 100 in which the grid nodes 115 are embedded in the polymer coating 130 without being fully encapsulated by the polymer coating 130.

The method commences in step (a) with the provision of a support 10, which may be any suitable support such as the support 10 as explained in more detail in the detailed description of FIG. 1. Alternatively, the support 10 may comprise a paper sheet. A mechanical support member, such as a support body 134 as previously discussed, is provided in the regions over the carrier 10 that define the grid nodes 115. In step (b), a polymer precursor coating 130' is formed over the mechanical support member, e.g. the support body 134. In case of the mechanical support member having a mesh structure, the polymer precursor coating 130' penetrates the mechanical support member, as previously explained. Any suitable polymer precursor may be used although a resin precursor such as an epoxy resin precursor is particularly preferred because of its adhesive properties and relative inflexibility after curing.

In step (c), the electrically conductive wires 110 are embedded in the polymer precursor coating 130', whilst keeping the upper surface of the electrically conductive wires 110 exposed. The precursor is subsequently cured to form the polymer coating 130, which secures the electrically conductive wires 110 onto the mechanical support member. Next the SSL elements 120 are mounted on the exposed upper surfaces of the electrically conductive wires 110, e.g. by soldering. As before, the SSL elements 120 may be directly mounted onto the electrically conductive wires 110 or may be mounted onto the electrically conductive wires 110 via a carrier such as a printed circuit board, as explained in more detail in the detailed description of step (a) of FIG. 1. The grid nodes 115 may subsequently be individualized, e.g. by dicing such as cutting, as previously explained, after which the lighting arrangement 100 may be stretched into its intended or desired shape as shown in step (e).

The resulting lighting arrangement 100 comprises a plurality of grid nodes 115 on a mechanical support member including a polymer coating 130 that secures the portions of the electrically conductive wires 110 forming part of the grid nodes 115 onto the support structure of the mechanical support member, e.g. the mesh portion 134, whilst the segments 112 of the electrically conductive wires 110 that interconnect the respective grid nodes 115 remain bare, i.e. uncovered by the polymer coating 130. It should however be understood that variations in which the segments 112 are coated with an elastomeric polymer coating are also feasible.

Figure 8:
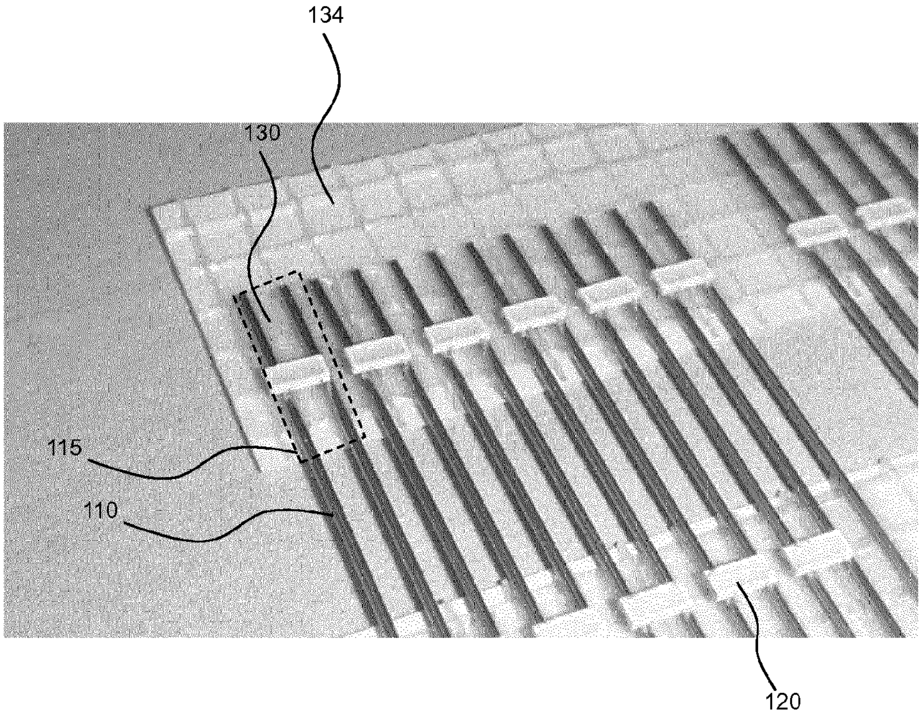
FIG. 8 is an image of a lighting arrangement of FIG. 7.

FIG. 8 shows an image of a lighting arrangement 100 manufactured in accordance with the method of FIG. 7 prior to individualization of the grid nodes 115 in which the portions of the electrically conductive wires 110 belonging to the grid nodes 115 are embedded in an epoxy resin on a mesh-structured support body 134 in the form of an glass fiber weave.

In the aforementioned embodiments, each grid node 15 comprises a pair of electrically conductive wire portions 110 onto which a single SSL element 120 is mounted either directly or via a carrier such as a printed circuit board. However, it should be understood that the concept of the present invention may be extended to lighting arrangements 100 that comprise a flexible grid of electrically conductive wires 110 and grid nodes 115 in which the grid nodes comprise N portions of such electrically conductive wires 110, in which N is a positive integer of at least 2.

In an embodiment, each grid node 115 comprises N portions of such electrically conductive wires 110 and (N−1) SSL elements 120, such that each SSL element 120 is mounted over a unique pair of electrically conductive wire portions, which preferably are neighboring wire portions.

Figure 9:
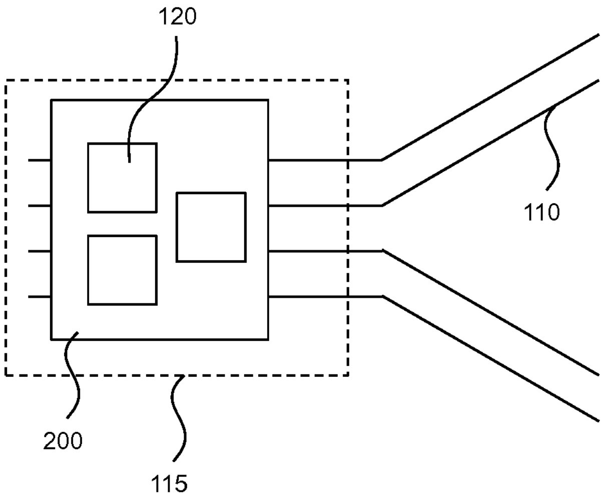
FIG. 9 schematically depicts an aspect of a lighting arrangement manufactured in accordance with the method of the present invention.
Figure 10:
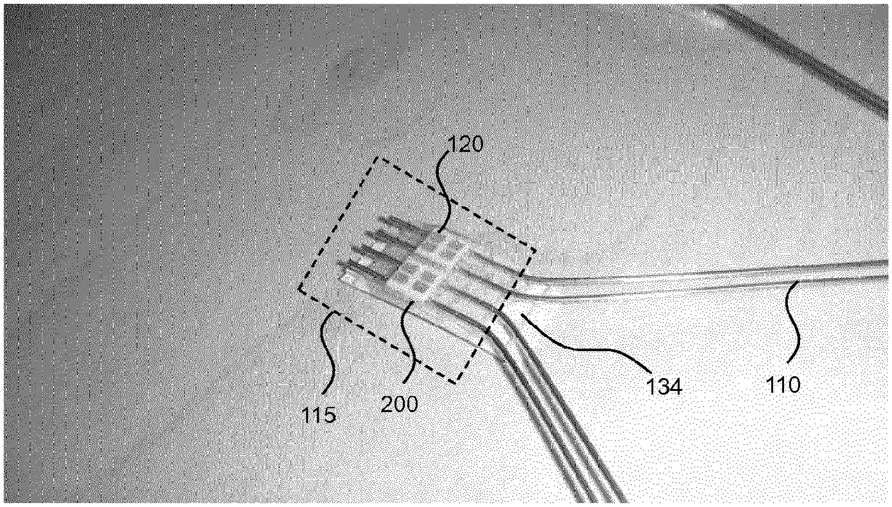
FIG. 10 is an image of the an aspect of a lighting arrangement of FIG. 9.

An example grid node 115 of such a lighting arrangement is schematically shown in FIG. 9, in which N is equal to 4. An image of such a grid node 115 is shown in FIG. 10, in which the grid node 115 is supported by a glass fiber weave 134 using an epoxy resin to immobilize the electrically conductive wires 110 as previously explained. The three SSL elements 120 may be different color SSL elements 120, e.g. a red LED, a green LED and a blue LED or any other suitable color combination, and may be mounted on a carrier 200, such as a printed circuit board. Alternatively, the SSL elements 120 may be mounted directly onto respective pairs of the electrically conductive wires 110 as previously explained.

Each SSL element 120 straddles a different pair of neighboring electrically conductive wires 110, with one of the electrically conductive wires 110 of said pair acting as a control signal wire to control the SSL element 120. Control signals may be provided on the control signal wires to individually control the (N−1) SSL elements 120 in each grid node 115, such that the lighting arrangement 100 is capable of producing time-varying color patterns. The individual control of SSL elements 120 such as LEDs is well-known per se and will not be explained in further detail for the sake of brevity only.

In an alternative embodiment, each carrier 200 comprises control logic, e.g. a microcontroller or logic chip for individually controlling the SSL elements 120 on the carrier 200. In this embodiment, the electrically conductive wires 110 may include one or more control signal wires for providing the control logic with instructions for individually controlling the SSL elements 120 on the carrier. In an embodiment, the control logic of each grid node 115 is individually addressable as is known per se, such that individual SSL elements 120 of individual grid nodes 115 of the lighting arrangement 100 may be controlled in this manner.

It should be understood that the control signals may be provided over the control signal wires in any suitable form, e.g. analog or digital control signals.

In an alternative embodiment, the additional electrically conductive wires 110 may provide additional power to the grid nodes 115, such that the thickness of the individual wires 110 can be reduced, which improves the design flexibility of the lighting arrangement 100, for instance because the wire thickness can be selected to tune the flexibility and/or the thickness of the lighting arrangement 100.

In the aforementioned embodiments, the electrically conductive wires 110 terminate in a grid node 115. However, it should be understood that it is equally feasible to define grid nodes 115 on intermediate sections rather than on terminal sections of the N electrically conductive wires 110. An example embodiment of a grid node 115 defined on such intermediate sections of the electrically conductive wires 110 is shown in FIG. 11, in which N is equal to 4 by way of non-limiting example only; it should be understood that N may be any suitable value, e.g. N is equal to 2 or more.

Figure 11:
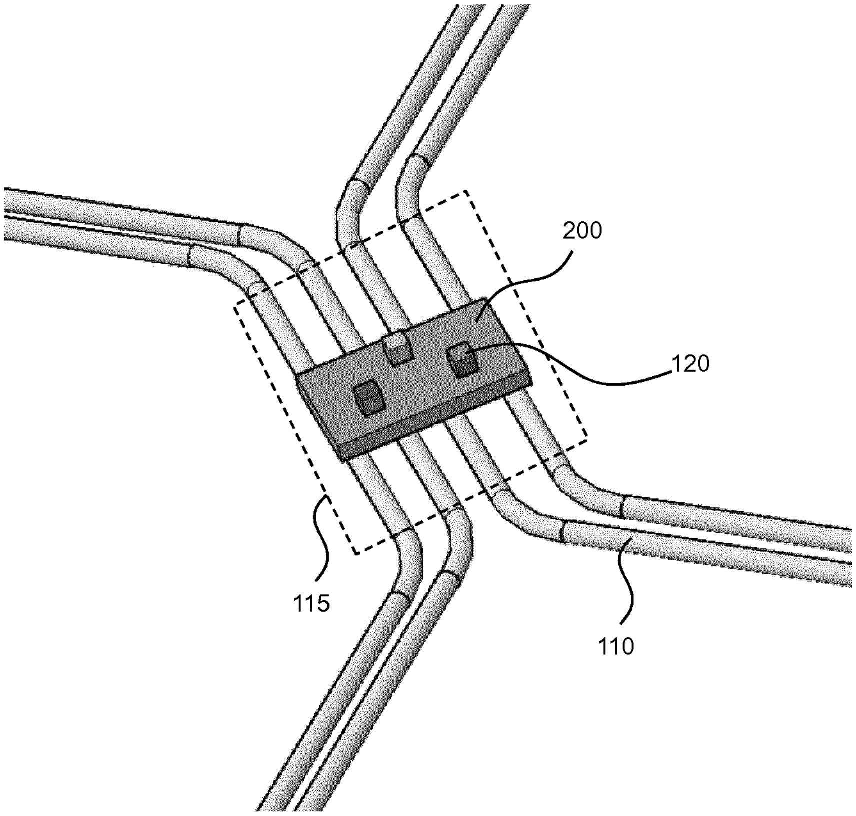
FIG. 11 schematically depicts an aspect of a lighting arrangement manufactured in accordance with the method of the present invention.

The grid node 115 shown in FIG. 11 comprises three SSL elements 120, e.g. SSL elements each emitting light of a different color, mounted on a carrier 200 by way of non-limiting example only; the grid node 115 may comprise any suitable number of SSL elements 120, which may be mounted on the electrically conductive wires 110 in any suitable manner, e.g. directly by placing the contacts of the SSL elements 120 into a solder paste on the electrically conductive wires 110 followed by a soldering step as previously explained. The spacing between the respective pairs of electrically conductive wires 110 increases on either side of the grid node 115, which is indicative of the grid node 115 being defined at an intermediate section of the four electrically conductive wires 110, as each pair of electrically conductive wires 110 proceeds to another grid node (not shown) on either side of the grid node 115. Obviously, for N is equal to 2 the pairs of electrically conductive wires 110 would become a single electrically conductive wire 110. Other variations will be apparent to the skilled person.

FIG. 11 simply demonstrates that many different flexible grid layouts may be contemplated, e.g. a grid layout with terminal grid nodes only, a grid layout with both terminal grid nodes and intermediate grid nodes, a grid layout with predominantly intermediate grid nodes and so on. Embodiments of the present invention provide a mechanical support member for such grid nodes irrespective of their relative position in the flexible grid to protect the grid nodes from being exposed to excessive stress generated during the deformation, e.g. stretching, of the flexible grid, thereby protecting the interconnects between the electrically conductive wires 110 and the one or more SSL elements 120 from becoming damaged by such stress. Consequently, any suitable grid layout may be contemplated.

At this point, it is noted that in any of the aforementioned embodiments, the grid nodes 115 comprising the SSL elements 120 may comprise additional functionality without departing from the teachings of the present invention. For instance, the grid nodes 115 may comprise optical functionality, e.g. reflective, diffusive and/or beam shaping elements, e.g. lenses, collimators and so on, to shape the luminous output of the SSL elements 120. Such optical functionality may be included in the grid nodes 115 in any suitable manner, e.g. by mounting on the support body 134 or a carrier of the SSL element 120, by inclusion in the polymer coating 130 or by mounting on the polymer coating 130 for instance. In an embodiment, the at least some of the grid nodes 115 may include coloring elements, e.g. a color filter suitably placed in the grid node 115 or a pigment in the polymer coating 130. Alternatively or additionally, the grid nodes 115 may include thermal functionality, e.g. thermal pads, thermal spreading elements, heat sink elements or thermal sensors for managing or monitoring the heat generated by the SSL elements 120.

It is furthermore noted that in any of the aforementioned embodiments, the lighting arrangement 100 may further comprise electrical circuit elements, such as for example resistors, transistors, capacitive coupling elements, diodes and so on to control the lighting arrangement 100. In an embodiment, the electrical circuit elements may be present in some of the grid nodes 115. The grid nodes 115 including the electrical circuit elements may further include a SSL element 120 or may instead be grid nodes 115 comprising electrical circuit elements only. The electrical circuit elements may be included in the grid nodes 115 in any suitable manner, e.g. by mounting the electrical circuit elements on a carrier such as a chip or PCB, which carrier may further comprise one or more SSL elements 120 and which may be integrated in the grid node 115 as previously explained.

For instance, one or more resistors may be included in the serial chain of SSL elements 120 to rectify differences in luminous output between the various SSL elements 120; the SSL elements 120 may for instance be binned prior to mounting the SSL elements 120 on the grid nodes 115, with grid nodes 115 comprising an SSL element 120 requiring luminous output correction being provided with such a resistor to implement the required correction.

For instance, several electrical circuit components may be combined to form one or more driver circuits for the SSL elements 120, which driver circuits may be integrated in a grid node 115 also comprising such a SSL element 120 or may instead be included in a separate grid node 115.

For instance, at least one grid node 115 may comprise connection leads conductively coupled to the conductive wires 110 for connecting the lighting arrangement to an external power supply such as a battery or mains power.

For instance, at least one grid node may comprise an integrated circuit for controlling the SSL elements 120, which integrated circuit may receive instructions via the aforementioned control signal wires, or may comprise a wireless transceiver for receiving such instructions in a wireless fashion.

For instance, at least one grid node 115 may comprise a sensor, e.g. a temperature sensor, a color sensor, a light output sensor and so on, for sensing a parameter of interest of the (environment of the) lighting arrangement 100 or the SSL element 120.

The above examples are non-limiting examples of electrical circuit elements that may be included in the grid nodes 115. Other examples will be apparent to the skilled person.

In yet another embodiment, at least one grid node 115 comprises a fixing member for fixing the lighting arrangement 100 to an external surface such as a wall or ceiling. Such a fixing member may for instance include a hole through the grid node 115 for receiving a screw, nail or the like, a hook or pad on the back of the grid node for mating with a fixing on the external surface, and so on. The fixing member may be included in a grid node 115 comprising a SSL element 120 and/or an electrical circuit element as described above or may form part of a separate grid node 115 dedicated to the fixing of the lighting arrangement 100 to the external surface.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a lighting arrangement, the method comprising:

winding a plurality of conductive wires in parallel on a support;

defining a plurality of grid nodes by conductively coupling a plurality of solid state elements to said plurality of conductive wires such that each solid state element is conductively coupled to a first one of said conductive wires and a second one of said conductive wires;

forming a mechanical support member at each grid node by embedding a portion of the first one of said conductive wires and a portion of the second one of said conductive wires in a polymer portion, wherein the mechanical support member comprises a support body;

dicing the mechanical support member to form a resultant structure; and removing the support from the resultant structure;

wherein said forming step comprises immobilizing the portion of the first one of said conductive wires and the portion of the second one of said conductive wires on the support body using said polymer portion.

2. The method of claim 1, wherein the support body comprises a mesh structure.

3. The method of claim 1, wherein said immobilizing step comprises encapsulating the portion of the first one of said conductive wires and the portion of the second one of said conductive wires in said polymer portion.

4. The method of claim 3, wherein the polymer portion is reinforced with a plurality of fibers or wires.

5. The method of claim 1, wherein said embedding step comprises encapsulating at least the plurality of grid nodes in the polymer portion.

6. The method of claim 5, wherein the step of encapsulating at least the plurality of grid nodes further comprises encapsulating sections of the conductive wires that interconnect grid nodes in said polymer portion.

7. The method of claim 1, wherein forming the mechanical support member comprises embedding said portion of the first one of said conductive wires and said portion of the second one of said conductive wires in the polymer portion comprising an elastomer or a resin.

* * * * *